(12) United States Patent
Zhang et al.

(10) Patent No.: US 9,966,340 B2
(45) Date of Patent: May 8, 2018

(54) FLEXIBLE SUBSTRATE FOR PACKAGING AND PACKAGE

(71) Applicant: BOE TECHNOLOGY GROUP CO., LTD., Beijing (CN)

(72) Inventors: Bo Zhang, Beijing (CN); Wenbo Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days. days.

(21) Appl. No.: 15/319,565

(22) PCT Filed: Feb. 16, 2016

(86) PCT No.: PCT/CN2016/073838
§ 371 (c)(1),
(2) Date: Dec. 16, 2016

(87) PCT Pub. No.: WO2017/036096
PCT Pub. Date: Mar. 9, 2017

(65) Prior Publication Data
US 2017/0200678 A1  Jul. 13, 2017

(30) Foreign Application Priority Data

Sep. 6, 2015 (CN) .......................... 2015 1 0561618

(51) Int. Cl.
*H01L 23/06* (2006.01)
*H01L 23/538* (2006.01)
(Continued)

(52) U.S. Cl.
CPC ...... *H01L 23/5387* (2013.01); *H01L 23/5386* (2013.01); *H01L 23/562* (2013.01); *H01L 25/0655* (2013.01)

(58) Field of Classification Search
CPC ... H01L 25/06; H01L 25/065; H01L 25/0655; H01L 23/53; H01L 23/538;
(Continued)

(56) References Cited

U.S. PATENT DOCUMENTS 9,213,139 B2 * 12/2015 Cok ................. G02B 6/138
2005/0205291 A1  9/2005 Yamashita et al.
(Continued)

FOREIGN PATENT DOCUMENTS

CN    102971841 A    3/2013
CN    103887261 A    6/2014
(Continued)

OTHER PUBLICATIONS

International Search Report dated Jun. 14, 2016 issued in corresponding International Application No. PCT/CN2016/073838 along with an English translation of the Written Opinion of the International Searching Authority.
(Continued)

*Primary Examiner* — Monica D Harrison
(74) *Attorney, Agent, or Firm* — Nath, Goldberg & Meyer; Joshua B. Goldberg

(57) ABSTRACT

The present invention provides a flexible substrate for packaging and a package. The flexible substrate for packaging includes a bendable region provided in a central region of the flexible substrate; chips provided at both sides of the bendable region and at both ends of the flexible substrate, respectively; and a wire provided to be connected between the chips and to pass through the bendable region. A portion of the wire corresponding to the bendable region is provided with an anti-stress structure, and the anti-stress structure is configured to release a tensile resistance and a compressive resistance when the bendable region is bent.

12 Claims, 3 Drawing Sheets

(51) Int. Cl.
*H01L 23/00* (2006.01)
*H01L 25/065* (2006.01)

(58) Field of Classification Search
CPC . H01L 23/5386; H01L 23/5387; H01L 23/56; H01L 23/562
USPC ............................................. 257/773
See application file for complete search history.

(56) References Cited

U.S. PATENT DOCUMENTS

| | | |
|---|---|---|
| 2012/0062447 A1 | 3/2012 | Tseng et al. |
| 2014/0217397 A1 | 8/2014 | Kwak et al. |
| 2016/0284774 A1 | 9/2016 | Zhang |

FOREIGN PATENT DOCUMENTS

| | | |
|---|---|---|
| CN | 104241295 A | 12/2014 |
| CN | 105047676 A | 11/2015 |

OTHER PUBLICATIONS

Office Action dated Jun. 23, 2017 issued in corresponding Chinese Application No. 201510561618.X.

\* cited by examiner

FLEXIBLE SUBSTRATE FOR PACKAGING AND PACKAGE

This is a National Phase Application filed under 35 U.S.C. 371 as a national stage of PCT/CN2016/073838 filed on Feb. 16, 2016, an application claiming the benefit of Chinese application no. 201510561618.X filed on Sep. 6, 2015, the content of each of which is hereby incorporated by reference in its entirety.

FIELD OF THE INVENTION

The present invention relates to the field of display technology, in particular, relates to a flexible substrate for packaging and a package, and more specifically, relates to a flexible substrate for packaging a 3D stack and a package.

BACKGROUND OF THE INVENTION

Nowadays, in an existing integrated package of chips and devices using a flexible substrate, with the increases in the number of the devices and in the integration degree thereof, more and more intensive wiring will be provided on the flexible substrate. At the same time, a curvature radius of a bendable region of a 3D stacked package formed by using the flexibility of the flexible substrate will become smaller and smaller. In this case, when the curvature radius becomes smaller and smaller or when a packaged product is subjected to frequently repeated bending operations in use, there may be a problem greatly reducing the packaging performance and the stability, such as the breakage of wires or the detachment of the wires from the substrate, occurring in the intensive wiring in the bendable region.

SUMMARY OF THE INVENTION

Problem to be Solved by the Present Invention

A problem to be solved by the present invention is how to avoid the problem greatly reducing the packaging performance and the stability, such as the breakage of wires or the separation of the wires from a flexible substrate, occurring in a package using the flexible substrate in the prior art.

Solutions to the Problem

To solve the above problem, the present invention provides a flexible substrate for packaging, which includes a bendable region provided in a central region of the flexible substrate; chips provided at both sides of the bendable region and at both ends of the flexible substrate, respectively; and a wire provided to be connected between the chips and to pass through the bendable region; wherein, a portion of the wire corresponding to the bendable region is provided with an anti-stress structure, and the anti-stress structure is configured to release a tensile resistance and a compressive resistance when the bendable region is bent.

In the flexible substrate for packaging, the anti-stress structure is a sub-wire of the wire which is extensible and retractable to deform.

In the flexible substrate for packaging, the sub-wire includes one or more curved portions.

In the flexible substrate for packaging, the sub-wire has a wave shape in the bendable region.

In the flexible substrate for packaging, the sub-wire has a continuous S-shape in the bendable region.

In the flexible substrate for packaging, the sub-wire has a continuous Ω-shape in the bendable region.

In the flexible substrate for packaging, the sub-wire has a continuous zigzag-shape in the bendable region.

In the flexible substrate for packaging, the sub-wire has a rectangular-tooth shape in the bendable region.

In the flexible substrate for packaging, the flexible substrate is a fully flexible substrate of which remaining regions other than the bendable region and the bendable region are integrally formed, and the bendable region and the remaining regions of the fully flexible substrate have a same hardness.

In the flexible substrate for packaging, the flexible substrate is a partially flexible substrate of which remaining regions other than the bendable region are objects different from the bendable region and are connected to the bendable region, and the bendable region has a smaller hardness than that of the remaining regions of the partially flexible substrate.

The present invention further provides a package, which includes an electronic device and the flexible substrate for packaging provided by the present invention, wherein the electronic device is electrically connected to the chips.

Advantageous Effects

The present invention achieves the following advantageous effects. When the bendable region is bent, the anti-stress structure of a wire in the flexible substrate for packaging provided by the present invention will release a tensile resistance and a compressive resistance, so as to increase the stability of the wire in a bending process of a 3D stacked package using the flexible substrate, thereby effectively solve the problem greatly reducing the packaging performance and the stability, such as the breakage of wires or the detachment of the wires from a flexible substrate, easily occurring in a package using the flexible substrate in the prior art. Further, the flexible substrate for packaging provided by the present invention has a simple configuration, and the manufacturing process thereof is mature, thereby facilitating its wide adoption.

DESCRIPTION OF REFERENCE NUMERALS

1 -chip, 2 -wire, 3 -bendable region, 4 -anti-stress structure, 5 -flexible substrate.

DETAILED DESCRIPTION OF THE EMBODIMENTS

Exemplary embodiments of the present invention will be described in detail below with reference to the accompanying drawings. The embodiments described below are for the purpose of explaining the present invention, rather than limiting the scope of the present invention.

It should be noted that, in the description herein, the term "a plurality of" or the like means two or more, unless the context indicates otherwise. Orientations or positional relationships indicated by the terms "upper", "lower", "left", "right", "inner", "outer", "front", "rear", "head", "tail", and the like are the orientations or positional relationships shown in the accompanying figures, and for the purpose of ease and simplification description of the present invention only, rather than indicating or implying that the referred-to device or element must have a certain orientation or must be fabricated or operated in a certain orientation, and thus should not be construed to limit the scope of the present invention. Further, the terms "first", "second", "third", and the like may be used herein to distinguish one element from another element, rather than limiting these elements.

It should be further noted that, in the description herein, the terms "being mounted on", "being joined to", "being connected to", and the like should be construed broadly, unless the context clearly indicates otherwise. For example, "being connected to" may mean "being fixedly connected to", "being detachably connected to", "being integrally connected to", "being mechanically connected to", "being electrically connected to", "being directly connected to", "being indirectly connected to via intermediate media", or the like. One of ordinary skill in the art should understand the terms used herein according to the context thereof.

First Embodiment

Figure 1:
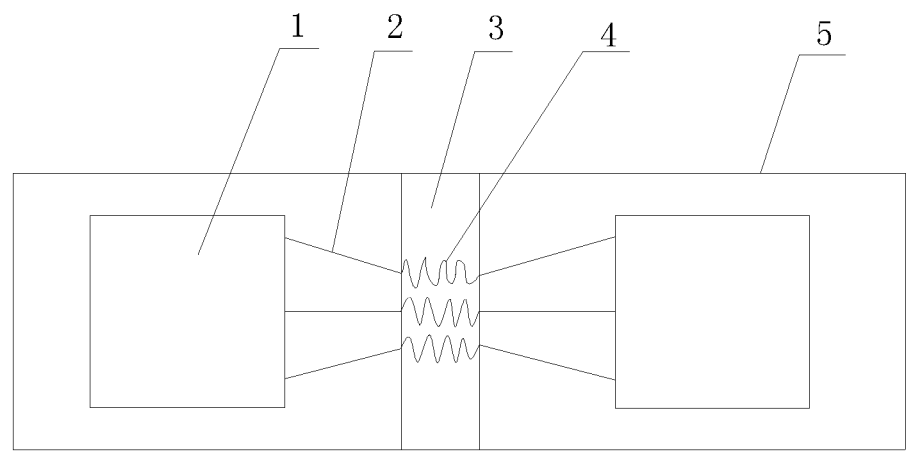
FIG. 1 is a schematic diagram showing a structure of a flexible substrate for packaging according to a first embodiment of the present invention.

As shown in FIG. 1, the present embodiment provides a flexible substrate for packaging. Herein, a bendable region 3 is provided in a central region of a flexible substrate 5, and chips 1 are provided at both sides of the bendable region 3 and at both ends of the flexible substrate 5, respectively. Wires 2 are provided to be connected between two chips 1 and pass through the bendable region 3. The wires 2 may include all wires passing through the bendable region 3 of the flexible substrate (i.e., wires located on the inner surface of the bendable region, wires located on the outer surface of the bendable region, and wires located inside the bendable region). Further, a portion of each of the wires 2 corresponding to the bendable region 3 is provided with an anti-stress structure 4. That is, a portion of each of the wires 2 located within the bendable region 3 is provided with the anti-stress structure 4. The anti-stress structure 4 is configured to release a tensile resistance and a compressive resistance when the bendable region 3 is bent, so as to increase the stability of the wire in a bending process of a 3D stacked package using the flexible substrate, thereby effectively solve the problem greatly reducing the packaging performance and the stability, such as the breakage of wires or the detachment of the wires from a flexible substrate, easily occurring in a package using the flexible substrate in the prior art.

Further, a configuration of the anti-stress structure 4 is not specifically limited, as long as the anti-stress structure 4 can release a tensile resistance and a compressive resistance. Optionally, the anti-stress structure 4 is a sub-wire of (i.e., a part of) each of the wires 2 which is extensible and retractable to deform, this configuration is simple and is easy to be widely adopted. For example, the sub-wire includes one or more curved portions (i.e., portions each have a curved shape), such that the one or more curved portions of the sub-wire can be stretched or compressed to deform so as to release a tensile resistance or a compressive resistance during the flexible substrate being bent. The one or more curved portions included in the sub-wire each may be a two-dimensional pattern. For example, the curved portions each may be in a plane parallel to the plane in which a surface of the flexible substrate is located, as shown in FIG. 1. Alternatively, the curved portions each may be in a plane having a predetermined angle with the plane in which the surface of the flexible substrate is located. In other embodiments, the one or more curved portions included in the sub-wire each may be a three-dimensional pattern, e.g., a spring-like shape.

Further, the flexible substrate 5 may be a fully flexible substrate or a partially flexible substrate, thereby being for general purpose. Also, the number of the wires 2 connected between the chips 1 is not specifically limited.

When the flexible substrate 5 is a fully flexible substrate, the entire substrate is a flexible structure. In this case, regions of the fully flexible substrate other than the bendable region 3 and the bendable region 3 are integrally formed, and the bendable region 3 and the remaining regions of the fully flexible substrate have a same hardness. When the flexible substrate 5 is a partially flexible substrate, only the central region (i.e., the bendable region 3) of the substrate is a flexible structure. That is, regions of the partially flexible substrate other than the bendable region 3 are objects different from the bendable region located in the central region and are connected to the bendable region, and the bendable region 3 has a smaller hardness than that of the remaining regions of the partially flexible substrate.

Second Embodiment

The portions of a second embodiment which are the same as in the first embodiment will not be repeated herein, and the disclosure of the first embodiment is also applicable to the present embodiment. The second embodiment is a variation from the first embodiment.

Figure 2:
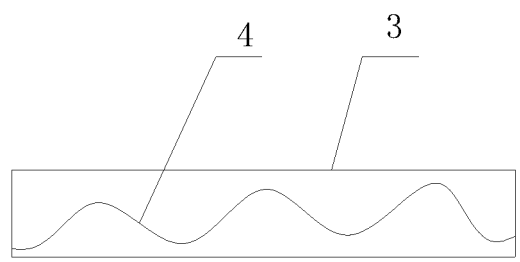
FIG. 2 is a schematic diagram showing an anti-stress structure according to a second embodiment of the present invention.

As shown in FIG. 2, the anti-stress structure 4 is a sub-wire of each of the wires 2 which is extensible and retractable to deform, and the sub-wire has a wave shape in the bendable region 3. That is, the curved portions included in the sub-wire appear as a wavy line having a peak and a valley. In a specific example, the sub-wire may have a shape of sinusoidal curve or cosine curve. Further, the sub-wire may be provided to be located within the bendable region 3 to transversely pass therethrough. When the bendable region 3 is bent, the sub-wire will release a stress in a tensile direction and a compression direction, so as to prevent the problem greatly reducing the packaging performance and the stability, such as the breakage of the wires or the separation of the wires from the flexible substrate, from occurring, thereby further increasing the stability of the wires in a bending process of a 3D stacked package.

Third Embodiment

Figure 3:
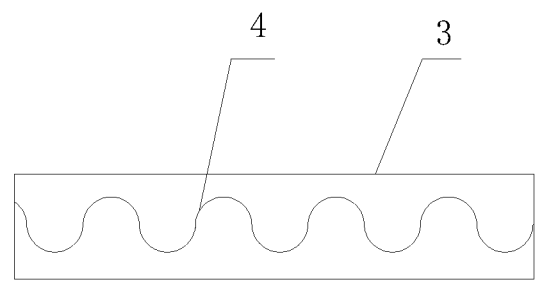
FIG. 3 is a schematic diagram showing an anti-stress structure according to a third embodiment of the present invention.

As shown in FIG. 3, to improve the effect of releasing a stress, a third embodiment is provided based on the second embodiment. Herein, the shape of the sub-wire is changed to a shape of continuous distribution of "S", i.e., the sub-wire has a continuous S-shape in the bendable region 3. Such a shape of continuous distribution of "S" may be construed as sequential connection of a plurality of the English letters "S", and may transversely pass through the bendable region 3. Herein, the English letter "S" is exemplified for ease of understanding, and other shapes similar to the letter "S" are also included in the present embodiment. Further, the curvature of the sub-wire in the present embodiment is greater than that of the sub-wire in the second embodiment, thus the sub-wire can release a greater stress when being bent. In a bending process of a 3D stacked package using the flexible substrate including the sub-wire of the shape according to the present embodiment, the effect of releasing a stress is improved, and the wires have an increased stability.

Fourth Embodiment

Figure 4:
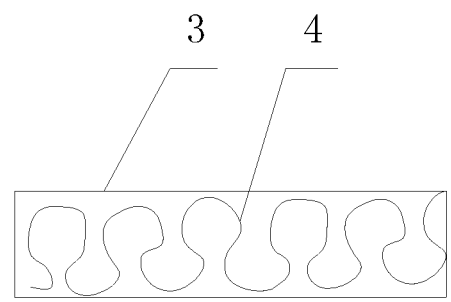
FIG. 4 is a schematic diagram showing an anti-stress structure according to a fourth embodiment of the present invention.

As shown in FIG. 4, a fourth embodiment may be provided based on the third embodiment. Herein, the sub-wire has a continuous Ω-shape in the bendable region 3. Such a Ω-shape may be construed as being similar to a dumbbell-end shape, and apparently, other shapes similar to the dumbbell-end shape are also included in the present embodiment. A plurality of Ω-shaped sub-wire units may be sequentially connected to each other and may be transversely provided in the bendable region 3. Apparently, the curvature of the 0-shaped sub-wire in the present embodiment is greater than that of the sub-wire in the third embodiment, thus the sub-wire can have a better effect of releasing a stress, and the wires have a higher stability.

Fifth Embodiment

Figure 5:
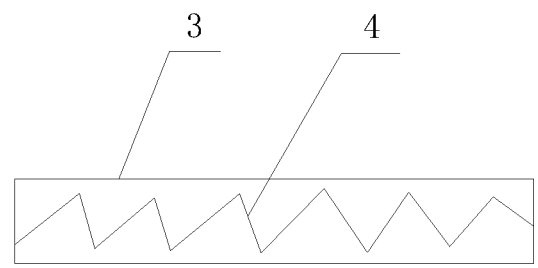
FIG. 5 is a schematic diagram showing an anti-stress structure according to a fifth embodiment of the present invention.

A shape of the sub-wire, which corresponds to the bendable region 3, of each of the wires 2 is not specifically limited, and may be designed according to practical requirements so as to be any shape that can release a stress. As shown in FIG. 5, the sub-wire has a continuous zigzag-shape in the bendable region 3. Herein, an angle between two adjacent straight-line segments of the sub-wire may be adjusted according to practical requirements. Apparently, a material of the wires 2 may be selected appropriately, for example, a copper wire, an aluminum wire, or the like may be used. Such a zigzag-shaped sub-wire can also release a stress when the bendable region is bent. Also, the problem greatly reducing the packaging performance and the stability, such as the breakage of the wires or the detachment of the wires from the flexible substrate, may be prevented from occurring, and the stability of the wires in a bending process of a 3D stacked package is further increased.

Sixth Embodiment

Figure 6:
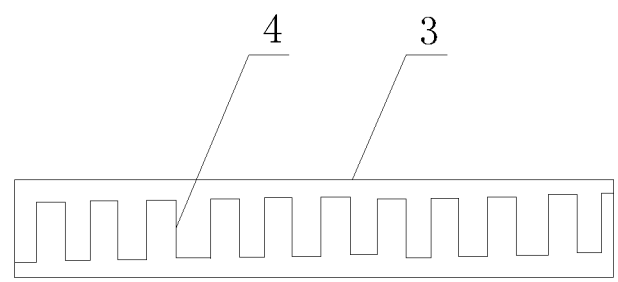
FIG. 6 is a schematic diagram showing an anti-stress structure according to a sixth embodiment of the present invention.

Further, the sub-wire may have another shape. As shown in FIG. 6, in a sixth embodiment, the sub-wire has a rectangular-tooth shape (i.e., a shape similar to the longitudinal section of a rectangular toothed bar) in the bendable region 3. Apparently, an interval between two adjacent rectangular-wire units of rectangular-tooth shape may be set appropriately. Thus, the anti-stress structure 4 may be configured in various forms, which cannot be exhausted. The above embodiments are selected and described for the purpose of better explaining the principle and practical applications of the present invention, rather than limiting the scope of the present invention to the specific forms as disclosed. The sub-wire in the present embodiment can also release a stress during a bending process of the bendable region 3, thereby increasing the stability of the wires in a bending process of a 3D stacked package using the flexible substrate including the sub-wire.

Seventh Embodiment

The present embodiment provides a package, which includes an electronic device and the flexible substrate 5 for packaging according to any one of the above embodiments. The bendable region 3 is provided in the central region of the flexible substrate 5, and the chips 1 are provided at both sides of the bendable region 3 and at both ends of the flexible substrate 5, respectively. The electronic device is electrically connected to the chips 1, and the wires 2 are provided to be connected between two chips 1 and pass through the bendable region 3. A portion of each of the wires 2 corresponding to the bendable region 3 is provided with the anti-stress structure 4.

Figure 7:
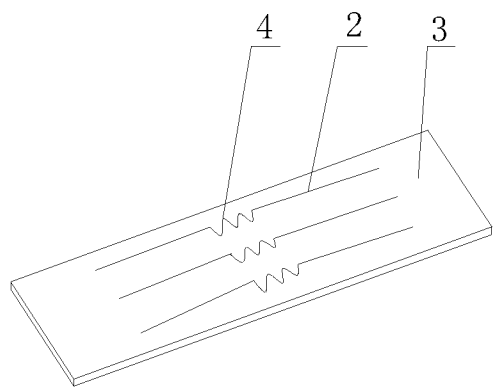
FIG. 7 is a schematic diagram showing a flexible substrate, which is in a two-dimensional state, of a package according to a seventh embodiment of the present invention.
Figure 8:
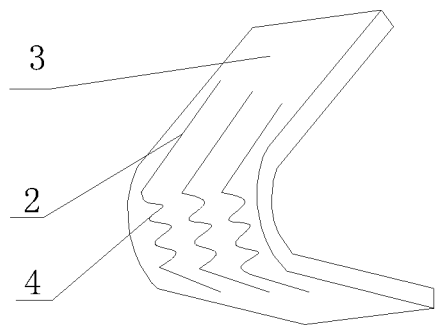
FIG. 8 is a schematic diagram showing the flexible substrate, which is slightly bent, of the package according to the seventh embodiment of the present invention.
Figure 9:
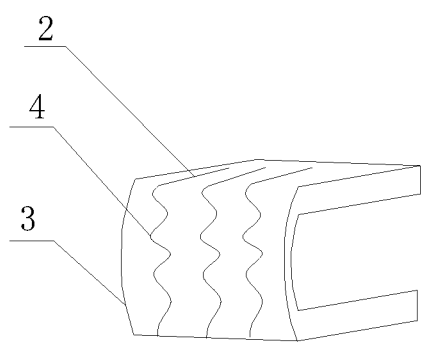
FIG. 9 is a schematic diagram showing the flexible substrate, which is significantly bent, of the package according to the seventh embodiment of the present invention.

FIG. 7 is a schematic diagram showing the flexible substrate, which is in a two-dimensional state, of a package according to the present embodiment. FIG. 8 is a schematic diagram showing the flexible substrate, which is slightly bent, of the package according to the present embodiment. FIG. 9 is a schematic diagram showing the flexible substrate, which is significantly bent, of the package according to the present embodiment.

Referring to FIGS. 7 to 9, in a process of 3D stacked packaging up the chips 1 by using the flexibility of the flexible substrate 5, a bending operation must be performed on the bendable region 3 of the flexible substrate 5. Herein, FIGS. 7 to 9 show a bending process that a two-dimensional flexible substrate 5 is bent to change into a three-dimensional flexible substrate 5, and then a package is formed after packaging the three-dimensional flexible substrate 5. Since the anti-stress structure 4 is provided, a stress, which is in a tensile direction or a compression direction, of the wires 2 in the bendable region 3 will be greatly reduced, thereby greatly increasing the stability of the wires in the bendable region 3.

Thus, in the flexible substrate for packaging provided by the present invention, when the flexible substrate is bent, the anti-stress structure of each of the wires will release a tensile resistance and a compressive resistance, so as to increase the stability of the wire in a bending process of a 3D stacked package using the flexible substrate, thereby effectively solve the problem greatly reducing the packaging performance and the stability, such as the breakage of wires or the detachment of the wires from a flexible substrate, occurring in a package using the flexible substrate in the prior art. Further, the flexible substrate for packaging provided by the present invention has a simple configuration, and the manufacturing process thereof is mature, thereby facilitating its wide adoption.

The above embodiments of the present invention are provided for the purpose of exemplification and description only, rather than being exhausted or limiting the scope of the present invention to the specific forms as disclosed. For one of ordinary skill in the art, various improvements and modifications may be readily made without departing from the scope of the appended claims. These improvements and modifications also fall within the protection scope of the present invention.

What is claimed is:

1. A flexible substrate for packaging, comprising:
   a bendable region provided in a central region of the flexible substrate;
   chips provided at both sides of the bendable region and at both ends of the flexible substrate, respectively; and
   a wire provided to be connected between the chips and to pass through the bendable region;

wherein, a portion of the wire corresponding to the bendable region is provided with an anti-stress structure, and the anti-stress structure is configured to release a tensile resistance and a compressive resistance when the bendable region is bent;

the flexible substrate for packaging further comprises non-bendable regions, the bendable region is located between the non-bendable regions, and the anti-stress structure is located between the non-bendable regions.

2. The flexible substrate for packaging according to claim 1, wherein, the anti-stress structure is a sub-wire of the wire which is extensible and retractable to deform.

3. The flexible substrate for packaging according to claim 2, wherein, the flexible substrate is a partially flexible substrate of which remaining regions other than the bendable region are objects different from the bendable region and are connected to the bendable region, and the bendable region has a smaller hardness than that of the remaining regions of the partially flexible substrate.

4. The flexible substrate for packaging according to claim 2, wherein, the sub-wire comprises one or more curved portions.

5. The flexible substrate for packaging according to claim 4, wherein, the sub-wire has a wave shape in the bendable region.

6. The flexible substrate for packaging according to claim 4, wherein, the sub-wire has a continuous S-shape in the bendable region.

7. The flexible substrate for packaging according to claim 4, wherein, the sub-wire has a continuous Ω-shape in the bendable region.

8. The flexible substrate for packaging according to claim 4, wherein, the sub-wire has a continuous zigzag-shape in the bendable region.

9. The flexible substrate for packaging according to claim 4, wherein, the sub-wire has a rectangular-tooth shape in the bendable region.

10. The flexible substrate for packaging according to claim 4, wherein, the flexible substrate is a partially flexible substrate of which remaining regions other than the bendable region are objects different from the bendable region and are connected to the bendable region, and the bendable region has a smaller hardness than that of the remaining regions of the partially flexible substrate.

11. The flexible substrate for packaging according to claim 1, wherein, the flexible substrate is a partially flexible substrate of which remaining regions other than the bendable region are objects different from the bendable region and are connected to the bendable region, and the bendable region has a smaller hardness than that of the remaining regions of the partially flexible substrate.

12. A package, comprising an electronic device and the flexible substrate for packaging according to claim 1, wherein the electronic device is electrically connected to the chips.

* * * * *